US007521267B2

(12) United States Patent
Dodd

(10) Patent No.: US 7,521,267 B2
(45) Date of Patent: Apr. 21, 2009

(54) THERMAL INKJET PRINTHEAD PROCESSING WITH SILICON ETCHING

(75) Inventor: Simon Dodd, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 92 days.

(21) Appl. No.: 11/564,782

(22) Filed: Nov. 29, 2006

(65) Prior Publication Data

US 2007/0084824 A1 Apr. 19, 2007

Related U.S. Application Data

(62) Division of application No. 09/932,055, filed on Aug. 16, 2001, now Pat. No. 7,160,806.

(51) Int. Cl.
*H01L 21/00* (2006.01)

(52) U.S. Cl. .......................... 438/21; 29/700; 29/890.1; 347/1; 257/E21.705

(58) Field of Classification Search .................. 438/21; 257/E21.705; 29/700, 890.1; 347/1
See application file for complete search history.

(56) References Cited

U.S. PATENT DOCUMENTS

| | | | | |
|---|---|---|---|---|
| 3,575,740 | A | 4/1971 | Castrucci | |
| 4,435,898 | A | 3/1984 | Gaur | |
| 4,719,477 | A * | 1/1988 | Hess | 347/59 |
| 4,947,192 | A | 8/1990 | Hawkins et al. | |
| 5,122,812 | A | 6/1992 | Hess et al. | |
| 5,159,353 | A | 10/1992 | Fasen et al. | |
| 5,211,806 | A | 5/1993 | Wong et al. | |
| 5,308,442 | A | 5/1994 | Taub et al. | |
| 5,387,314 | A | 2/1995 | Baughman et al. | |
| 5,635,966 | A | 6/1997 | Keefe et al. | |
| 5,790,154 | A | 8/1998 | Mitani | |
| 6,019,907 | A | 2/2000 | Kamaura | |
| 6,132,032 | A | 10/2000 | Bryant et al. | |
| 6,137,443 | A | 10/2000 | Beatty et al. | |
| 6,158,846 | A | 12/2000 | Kawamura | |
| 6,217,155 | B1 | 4/2001 | Silverbrook | |
| 6,412,919 | B1 * | 7/2002 | Ghozeil et al. | 347/57 |
| 6,543,884 | B1 | 4/2003 | Kawamura et al. | |
| 6,675,476 | B2 | 1/2004 | Hosteller | |

FOREIGN PATENT DOCUMENTS

| | | |
|---|---|---|
| EP | 1078754 A2 | 2/2001 |
| WO | WO 99/03681 | 1/1999 |

* cited by examiner

*Primary Examiner*—Walter L Lindsay, Jr.
*Assistant Examiner*—Abdulfattah Mustapha

(57) ABSTRACT

A method of etching the trench portions of a thermal inkjet printhead using a robust mask that precisely defines the area of the substrate surface to be etched and that protects the adjacent drop generator components from damaging exposure to the silicon etchant. The process in accordance with the present invention uses as a mask some of the material that is also used in patterned layers for producing the drop generator components on the substrate. The placement of the mask components on the substrate occurs simultaneously with the production of the drop generator components, thereby minimizing the time and expense of creating the silicon-etchant mask.

7 Claims, 5 Drawing Sheets

THERMAL INKJET PRINTHEAD PROCESSING WITH SILICON ETCHING

This non-provisional U.S. patent application is a divisional of U.S. patent application Ser. No. 09/932,055, filed on Aug. 16, 2001, now U.S. Pat. No. 7,160,806 by inventor Simon Dodd, titled "Thermal Inkjet Printhead Processing with Silicon Etching," which is incorporated by reference herein.

TECHNICAL FIELD

This invention relates to the production of thermal inkjet printheads, including a way of masking the silicon substrate of the printhead for etching of the substrate.

BACKGROUND OF THE INVENTION

An inkjet printer typically includes one or more cartridges that contain ink. In some designs, the cartridge has discrete reservoirs of more than one color of ink. Each reservoir is connected via a conduit to a printhead that is mounted to the body of the cartridge. The reservoir may be carried by the cartridge or mounted in the printer and connected by a flexible conduit to the cartridge.

The printhead is controlled for ejecting minute drops of ink from the printhead to a printing medium, such as paper, that is advanced through the printer. The printhead is usually scanned across the width of the paper. The paper is advanced, between printhead scans, in a direction parallel to the length of the paper. The ejection of the drops is controlled so that the drops form images on the paper.

The ink drops are expelled through nozzles that are formed in a plate that covers most of the printhead. The nozzle plate may be bonded atop an ink barrier layer of the printhead. That barrier layer is shaped to define ink chambers. Each chamber is in fluidic communication with and is adjacent to a nozzle through which ink drops are expelled from the chamber. Alternatively, the barrier layer and nozzle plate can be configured as a single member, such as a layer of polymeric material that has formed in it both the ink chambers and associated nozzles.

The mechanism for expelling ink drops from each ink chamber (known as a "drop generator') includes a heat transducer, which typically comprises a thin-film resistor. The resistor is carried on an insulated substrate, such as a silicon die. The resistor material layer is covered with suitable passivation and cavitation-protection layers.

The resistor has conductive traces attached to it so that the resistor can be selectively driven (heated) with pulses of electrical current. The heat from the resistor is sufficient to form a vapor bubble in each ink chamber. The rapid expansion of the bubble propels an ink drop through the nozzle that is adjacent to the ink chamber.

Many of the components of the drop generators are fabricated or processed in ways that include photoimaging techniques similar to those used in semiconductor device manufacturing. The components are incorporated into and carried on a front surface of the rigid silicon substrate. The front surface of the substrate is also shaped by etching to form a trench in that surface. The trench is later connected with a slot that is cut through the back of the substrate so that liquid ink may flow from the reservoir, through the connected slot and trench, and to the individual drop generators.

The trench that is etched in the substrate surface is located adjacent to the drop generator components. Also, the silicon etching that forms the trenches takes place after some or all of the drop generator components have been added to the substrate. Therefore, it is important to form the substrate trenches in a manner that does not damage drop generator components. In this regard, the portion of the silicon substrate that is etched must be carefully defined on the substrate. This definition may be accomplished by masking the area to be etched with material that resists the effects of the etchant that is used for etching the trenches in the silicon. Moreover, production efficiency requires that this masking task be accomplished with minimal interference with, or delay in carrying out, the steps associated with producing the thermal inkjet printhead.

SUMMARY OF THE INVENTION

The present invention is directed to a method of etching the trench portions of a thermal inkjet printhead using a robust mask that precisely defines the area of the substrate surface to be etched and that protects the adjacent drop generator components from damaging exposure to the silicon etchant.

A process in accordance with the present invention uses as a mask some of the material that is also used in patterned layers for producing the drop generator components on the substrate. The placement of the mask components on the substrate occurs simultaneously with the production of the drop generator components, thereby minimizing the time and expense of creating the silicon-etchant mask.

The process and apparatus for carrying out the invention are described in detail below. Other advantages and features of the present invention will become clear upon review of the following portions of this specification and the drawings.

DETAILED DESCRIPTION OF PREFERRED EMBODIMENTS

Figure 8:
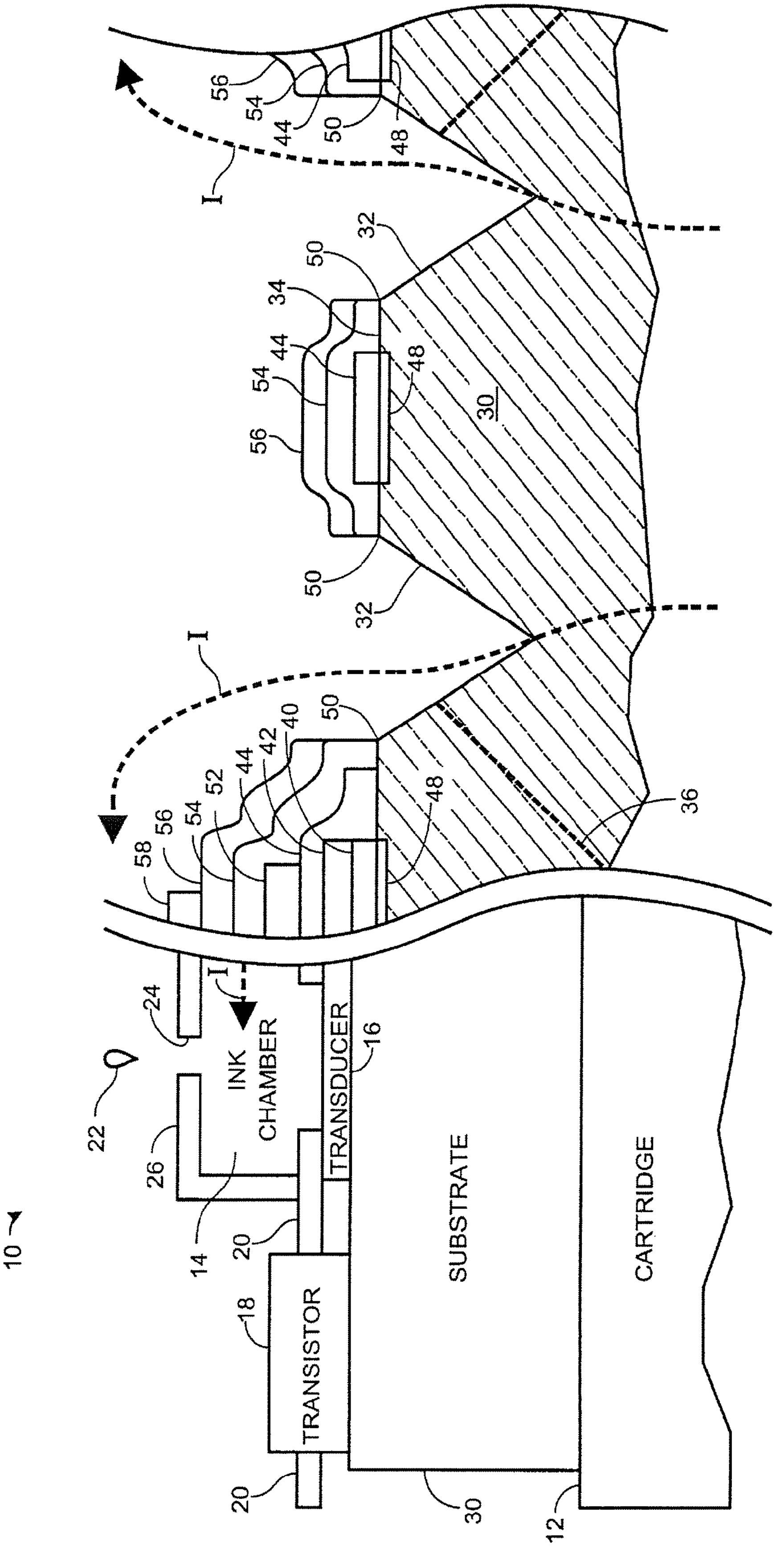

Reference is made first to FIG. 8, which diagrammatically illustrates the primary components of a thermal inkjet printhead 10 that is connected to a cartridge 12 that supplies ink to the printhead.

The printhead 10 includes a number of ink chambers 14 (one of which is diagrammed in FIG. 8) that hold a small volume of ink adjacent to a heat transducer 16. The heat transducer 16 primarily comprises a thin-film resistor covered with protective layers as described more fully below. The transducer is supplied with current pulses that are controlled in part by a transistor 18 that is incorporated into the printhead 10.

The current pulses are conducted to the transistor 18 and resistor via a patterned layer of electrically conductive material 20. The current applied to the transducer 16 causes the resistor to heat instantaneously to a temperature that is sufficient for vaporizing some of the ink in the chamber 14. The rapid growth of the vapor bubble in the chamber 14 expels a tiny ink drop 22 through one of the nozzles 24 of an orifice plate 26 that covers that part of the printhead. Each chamber 14 has a single nozzle associated with it.

The mechanism for expelling an ink drop as just explained can be characterized as "firing" an ink drop. In a typical printhead, multiple ink chambers are fired at a high frequency to produce a multitude of drops that are captured on media to form an image. The combination of components employed for firing a drop can be characterized as a drop generator. The drop generator is incorporated onto a die of a silicon wafer, which die forms a substrate 30 of the printhead 10. The substrate provides a rigid, planar member for supporting the remaining printhead components. In this embodiment, the substrate 30 is also doped to provide the source, gate, and drain elements of the transistor 18.

A thin, flexible circuit (not shown) is attached to the cartridge 12. The circuit may be a polyimide material that carries conductive traces. The traces connect to contact pads on the printhead for providing the current pulses though the conductive material 20 (gated through the transistor 18) under the control of a microprocessor that is carried in the printer with which the cartridge 12 is used.

The transistor 18, conductive material 20, and transducer 16 each comprise selected combinations of layers of material that are deposited or grown on the substrate 30 using processes adapted from conventional semiconductor component fabrication. The right side of FIG. 8 is greatly enlarged for illustrating a portion of the layers of material remaining on the substrate 30 after completion of the drop generator.

The right side of FIG. 8 also shows a pair of trenches 32 that have been etched into the front surface 34 of the substrate 30. These trenches 32 will be in fluid communication with a slot 36 (shown by the pair of dashed lines in the substrate 30) that is later cut into the substrate (as by abrasive jet machining) from the back surface of the substrate. The resultant fluid communication between the slot and trenches permits the flow of ink (such flow illustrated by the dashed lines labeled "I", in FIG. 8) from a reservoir carried in the cartridge 12, through the substrate 30, and over part of the front surface of the substrate to supply the ink chambers 14 described above.

An exemplary method of fabricating a thermal inkjet printhead structure having drive transistors thereon is described in U.S. Pat. No. 4,122,812 to Hess et. al, hereby incorporated by reference.

The present invention is directed to a method of etching the trenches 32 on the substrate surface 34 by using a robust mask that precisely defines the trench area at the substrate surface and that protects the adjacent drop generator components from damaging exposure to the etchant. The mask is applied to the substrate to physically define the trenches 32 and block contact between the etchant and other parts of the drop generators. As such, the mask is considered a "hard" mask, as opposed to a conventional photolithographic mask that is placed between a source of light and photosensitive material for defining shapes on the photosensitive material by preventing exposure of selected areas.

The process in accordance with the present invention uses as a mask some of the material that is also used in producing the drop generators on the substrate 30. The placement of the mask on the substrate occurs simultaneously with the production of the drop generator layers, thereby minimizing the time and expense of creating the silicon-etchant mask. One preferred approach to the process of applying the hard mask will now be described in stepwise fashion, beginning with FIG. 1.

Figure 1:
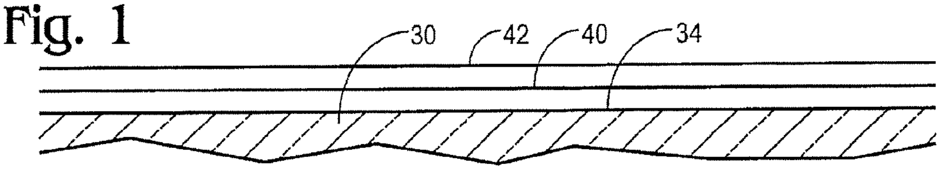
FIGS. 1-8 illustrate the steps undertaken in accordance with one aspect of this invention for processing a thermal inkjet printhead with silicon etching.

FIG. 1 illustrates the front surface 34 of the silicon substrate 30. A thin layer (about 1000 Angstroms, Å) of silicon oxide 40 is grown on the front surface of the substrate. As respects the drop generator components, this layer 40 will ultimately define the gate dielectric layer of the transistor 18 (FIG. 8) and, therefore, will be hereafter identified as the gate oxide layer or "GOX" layer 40.

Atop the GOX layer 40 there is deposited a 1000 Å layer of polysilicon 42, which can be applied using a low-pressure chemical vapor deposition (LPCVD) process with, for example, SiH4 as a reactant gas to deposit the layer at 620° C.

Figure 2:
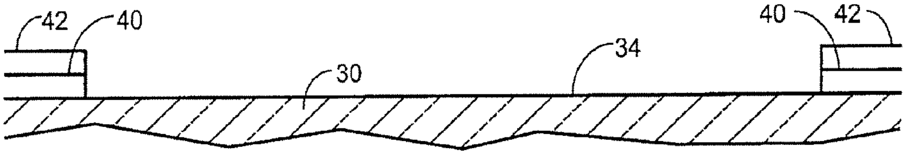

FIG. 2 shows that the GOX 40 and polysilicon 42 layers have been etched away in the area of the substrate surface 34 where the above-mentioned trenches 32 are to be formed (for convenience, this area is hereafter referred to as the trench area). In this regard, the process steps for fabrication of the drop generator components associated with this substrate (that is, the components diagrammed on the left side of FIG. 8) call for the use of a photoresist layer and photolithographic mask ("photomask") to define the gate region of the transistor 18. Coincident with this step, the process of the present invention uses that photomask step to define the region that is shown etched through the polysilicon and GOX layers in FIG. 2. The etching of these layers is carried out using, for example C2F6 for removing any native oxide on the polysilicon layer, followed by a combination C12 and He to etch polysilicon. The GOX is etched with a combination of CF4, CHF3 and Ar. An area of the GOX and polysilicon layer remains to form part of the transistor gate.

Figure 3:
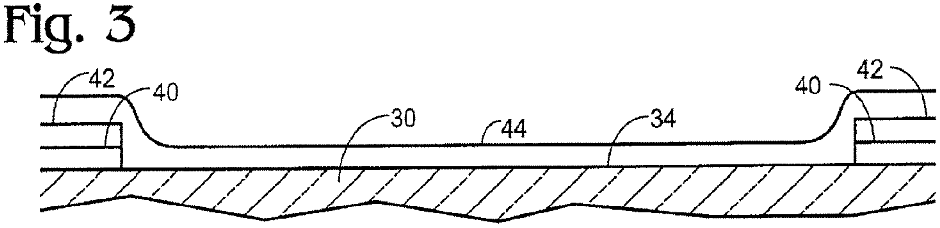

Following the etching step just described, the substrate is doped in conventional fashion to define the gate, source, and drain of the transistor 18. Next (FIG. 3), a layer of phosphosilicate glass (PSG) is deposited using plasma-enhanced chemical vapor deposition (PECVD). The PSG layer 44 is about 8000 Å thick (the layers not being shown to scale in the figures). As respects the drop generator components, the PSG layer serves as a dielectric layer for isolating the transistor gate, source, and drain on the substrate. The PSG that is deposited for this drop-generator function is simultaneously deposited over the exposed trench area of the substrate front surface 34 as shown in FIG. 3.

Figure 4:
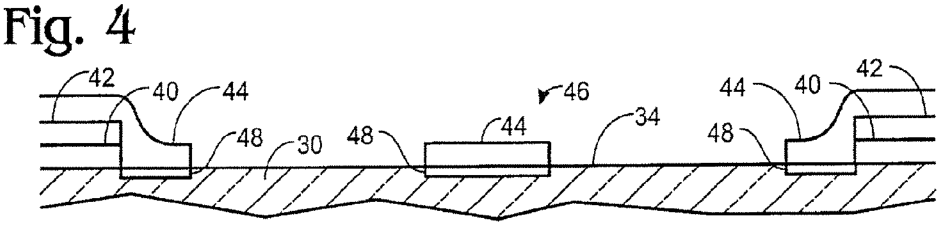

As respects the silicon-etch hard masking of the present invention, the PSG layer 44 is patterned and etched as shown in FIG. 4 at the same time (using the same photomask) that the PSG is also patterned and etched in the drop generator area to provide openings where a subsequently deposited metal layer can contact the transistor source, drain and gate, as well as the substrate. The PSG etching may be carried out using, for example, a combination of CF4, CHF3 and Ar.

With reference to FIG. 4, a preferred approach to the present invention provides for etching the silicon substrate front surface 34 to define two separate trenches 32 (see FIG. 8). To this end, the PSG 44 is patterned and etched to define a strip 46 of the PSG that is in direct contact with the substrate surface 34 at the center of the trench area. On both sides of the strip 46, the PSG is patterned so that its edges completely cover the GOX 40 and polysilicon 42 layers and extend into contact with the substrate surface 34, close to where the trench boundaries are to be defined. The trench boundaries are the junctions of the trenches with the front surface 34 of the substrate, shown at 50 in FIG. 8.

A thin layer of silicon oxide 48 forms where the PSG layer 44 contacts the silicon surface 34 in the trench area, which, as mentioned above, is near the trench boundaries. This oxide layer 48 resists the silicon etchant, thereby providing a secondary or backup hard mask to the primary hard mask that is described more fully below.

It is noteworthy here that although preferred embodiments of the present invention are described for use in defining two trenches, the same hard mask processes could surely be used where fewer or more than two trenches are desired.

Figure 5:
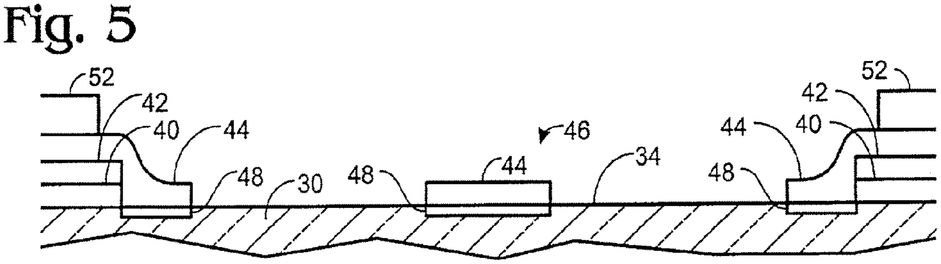

FIG. 5 illustrates a layer of metals 52 that is deposited over the PSG layer 44, patterned using a photomask, and later etched for the purpose of providing the resistive and conductive material for the heat transducer 16 and conductive layer 20, respectively. Preferably, the metals are deposited in sequence using the same metal deposition tool, with the resistive material comprising TaAl (about 900 Å thick) and the conductive material comprising AlCu (about 9000 Å thick). This metals layer 52 does not have a direct role in the hard masking of the present invention. As such, it is etched completely from the central strip 46 in the trench area.

Figure 6:
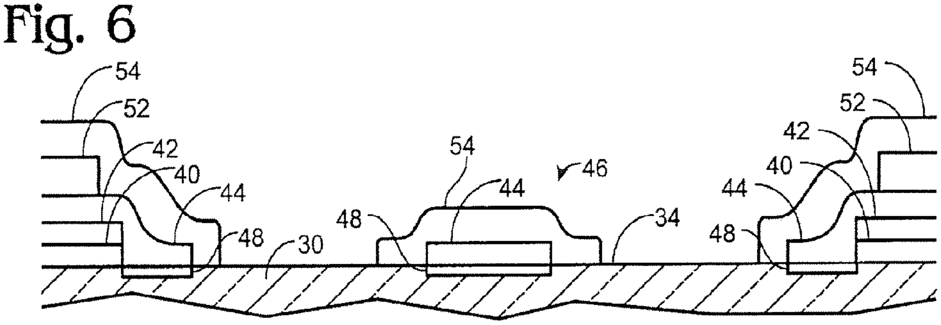

FIG. 6 illustrates the deposition of a layer of passivation material 54. As respects the drop generator components, this layer covers and protects the resistor of the heat transducer 16 from corrosion and other deleterious effects that might occur if the resistor were exposed to ink. The passivation material may be made up of a deposit of SiN (about 2,500 Å) covered with a deposit of SiC (about 1,250 Å). A conventional PECVD reactor may be employed for this deposition.

In this embodiment of the invention, the passivation material 54 also provides a primary component of the hard mask for etching the trenches 32. Thus, after the passivation layer is deposited, it is patterned using a conventional photomask, and thereafter etched (via a dielectric "dry" etch) to expose the portion of the silicon substrate surface 34 that will be etched to define the trenches 32. That is, the passivation layer 54 acts as a hard mask and defines the boundaries 50 (FIG. 8) of the trenches 32.

The photomask and etching process steps applied to the passivation layer 54 to define the hard mask edges as just described are integrated with (performed simultaneously with) the masking and etching of some of the passivation material that is located away from the trenches for the purpose of defining openings through the material 54. The openings permit a later-deposited metal layer to contact the metals layer 52 underlying the passivation layer 54. This contact provides electrical connection of the drop generator components (transistor 18, conductor 20, and transducer 16) with electrical leads that connect with the printer multiprocessor.

Figure 7:
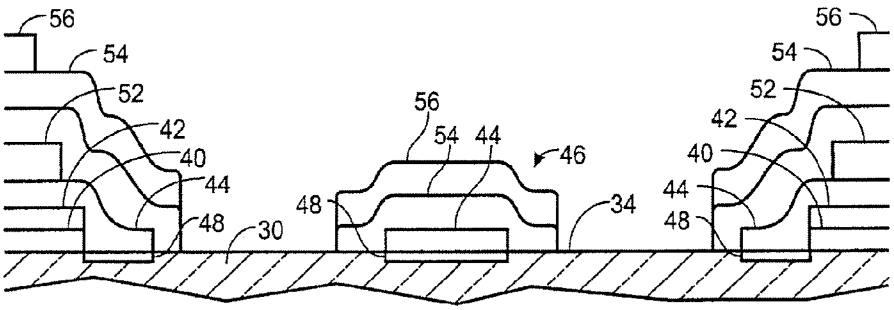
Figure 9:
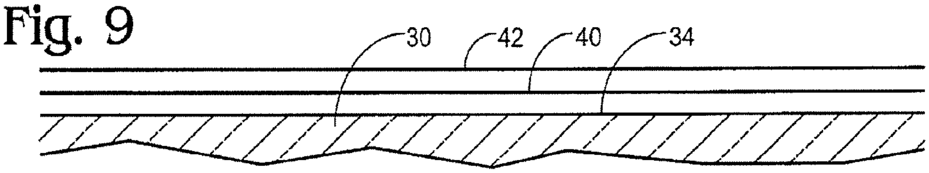
FIGS. 9-17 illustrate the process steps undertaken in accordance with another aspect of this invention.
Figure 10:
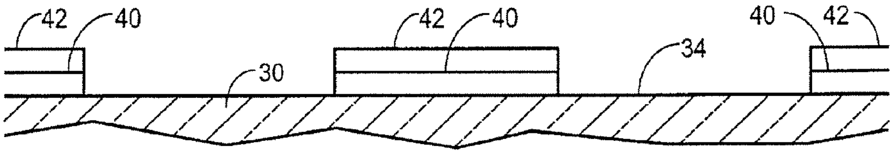

FIG. 7 shows a metal layer 56, preferably Tantalum (Ta) deposited over the passivation layer 54. As respects the drop generator, the metals layer 52 covers the area above the resistor (atop the passivation layer 54) to provide a barrier that prevents degradation of the resistor that would otherwise occur as a result of the cavitation effect that is attendant with the collapse of the vapor bubble after an ink drop has been fired from the ink chamber. The layer 56 of metal is also extended to cover the passivation material layer 54 at the boundaries 50 of the trenches 32 as well as on the strip 46. This extension of the metal layer provides a protective cover over the passivation layer 54 at locations where that passivation layer serves as a hard mask. This is explained more below. The shape of the cavitation-protection layer 56 (covering the resistor area as well as the edges of the passivation hard mask) is determined by photomask and dry etching steps that occur after the etching of the metal layer that is described next.

Layer 58 is another metal layer, preferably gold (Au), that is deposited for use with the drop generator components (this layer has no role with respect to the hard mask) and is etched away except for locations where it serves as electrical contact pads in communication with metals layer 52.

The metal layer 56 that is deposited before the Au layer 58 prevents degradation of the passivation-material hard mask 54 that might occur if that layer 54 were directly exposed to the metal wet-etching step that defines the Au contact pads. Thus, the protective metal 56 maintains the definition of the passivation material edge to ensure that the boundaries of the trenches 32 are, in turn, precisely defined.

With the hard mask in place, the trenches 32 are then etched into the silicon substrate surface 34 using tetra-methyl ammonium hydroxide, potassium hydroxide or another anisotropic silicon etchant that acts upon the exposed portions of the surface 34 between the trench boundaries 50 and not upon the passivation hard mask 54. In one embodiment, the etchant works upon the <100> plane of the silicon substrate 30 to etch the silicon at an angle. The etching process continues with the silicon etched downwardly at an angle until the angled lines intersect at a given depth, which may be for example, 50 micrometers (FIG. 8). The photomask maintains the boundaries 50 of the trenches as well as protects the underlying drop generator components from deleterious effects of the silicon etchant.

The silicon etching is followed by the abrasive jet machining that defines the slot 36 mentioned above for delivering ink "I" from a supply to the firing chambers of an operating printhead.

FIGS. 9-17 illustrate the process steps undertaken in providing a hard mask in accordance with another aspect of this invention. The first two steps of this approach are the same as the first two steps of the previous embodiment, thus FIGS. 9 and 10 match FIGS. 1 and 2, the same reference numbers are used to define the substrate 30, substrate surface 34, GOX layer 40 and polysilicon layer 42 shown in FIGS. 9 and 10. Unless otherwise noted, the photomask and etching procedures associated with particular layers discussed above in connection with the previous embodiment are also used in this embodiment.

Figure 11:
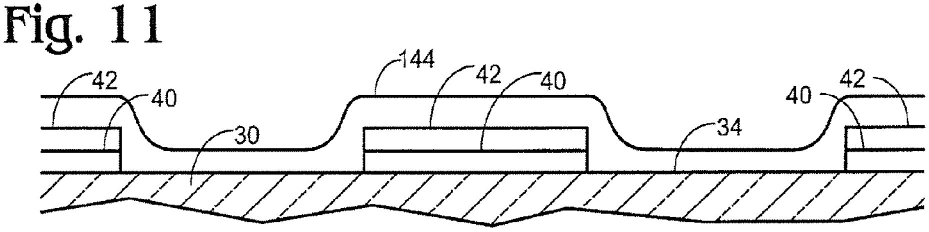

FIG. 11 shows a layer of PSG 144 (about 8000 Å thick) that is deposited over and covers GOX 40 and polysilicon layers 42. As respects the drop generator components, the PSG layer 144 serves as a dielectric layer for isolating the transistor gate, source, drain and substrate, as mentioned above.

Figure 12:
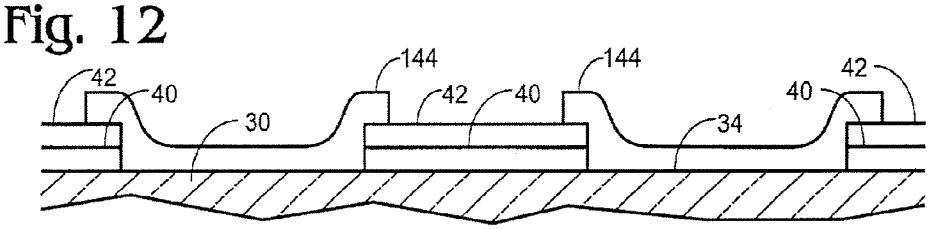

As respects the silicon-etch hard masking of the present invention, the PSG layer 144 is patterned and etched as shown in FIG. 12 at the same time (using the same photomask) that the PSG is patterned and etched to provide openings where a subsequently deposited metal layer can contact the transistor source, drain, and gate, as well as the substrate 30.

Figure 17:
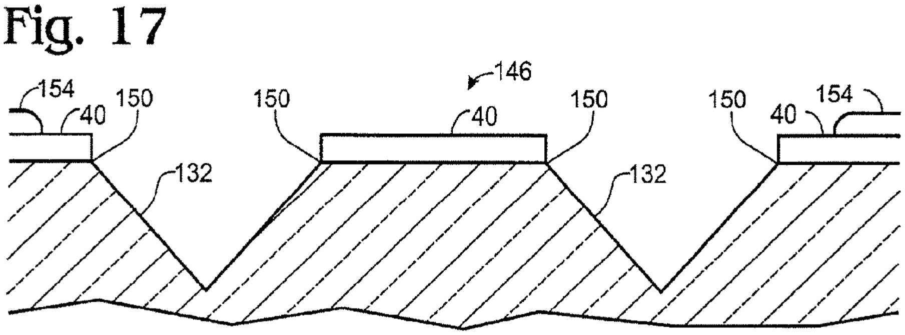

The PSG layer 144 is etched so that the edges of that layer (FIG. 12) completely cover the GOX 40 and polysilicon 42 layers where those layers 40, 42 abut the boundaries 150 of the later-etched trenches 132 (FIG. 17).

Figure 13:
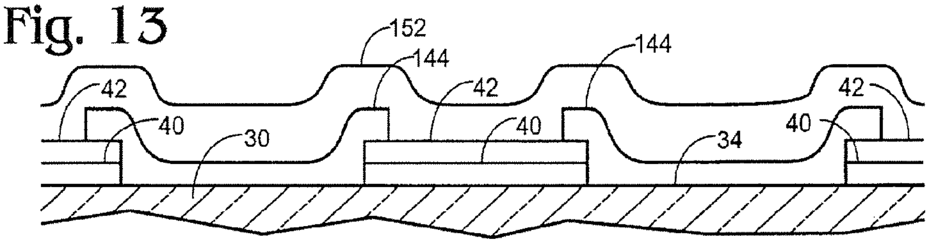
Figure 14:
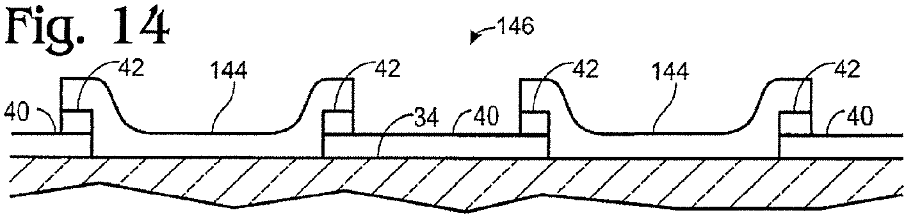

FIG. 13 illustrates a layer of metals 152 that is deposited over the PSG layer 144, patterned using a photomask, and later etched (FIG. 13 illustrating the layer before etching; FIG. 14, after etching) for the purpose of providing the resistive and conductive material for the heat transducer 16 and conductive layer 20, respectively, as described above. Preferably, the metals are deposited in sequence using the same metal deposition tool, with the resistive material comprising TaAl (about 900 Å thick) and the conductive material comprising AlCu (about 9000 Å thick). This metals layer does not have a direct role in the hard masking of this embodiment of the present invention. As such, it is etched from the central strip 146 in the trench area (FIG. 17).

Figure 15:
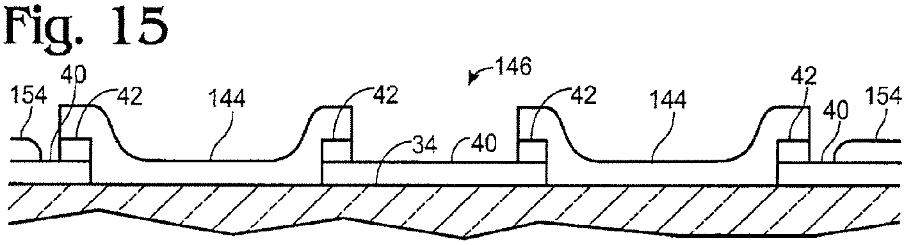

The process of etching the metals layer also removes, as seen in FIG. 15, polysilicon material 42 that is not covered by the PSG 144. The PSG 144 thus protects the edge of the GOX 40 and polysilicon 42 at the boundaries 150 of the trenches 132.

FIG. 15 also illustrates the deposition of a layer of passivation material 154 that, as respects the drop generator components, covers and protects the resistor of the heat transducer 16 for the reasons mentioned above in connection with the first-described embodiment.

As respects the hard mask of this embodiment, it will be appreciated (see FIG. 17) that the GOX layer 40 primarily serves that purpose by defining at its edges the boundaries 150 of the trenches 132. The passivation layer 154 is applied over the GOX layer and extends near those GOX layer edges. The resulting robust seal between the passivation material 154 and the GOX layer 140 prevents the silicon etchant from moving across the GOX layer to attack polysilicon material that remains (not shown) in the vicinity of the drop generator.

Figure 16:
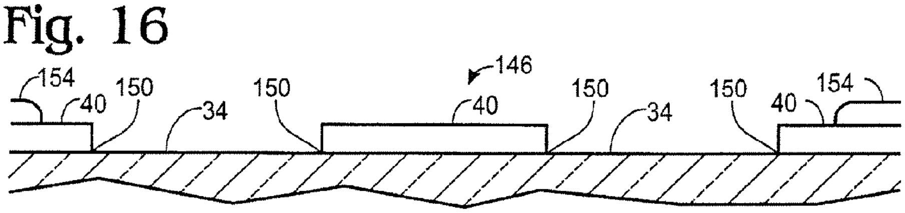

After the passivation layer 154 is applied, metal layers like those described above with respect to layers 56 and 58 are deposited and etched in the vicinity of the drop generator but are not present as features of the hard mask of this embodiment. Once the configuration of the final (gold) contact layer is completed, the temporary PSG 144 protection, as well as the bit of polysilicon 42 underlying the PSG, is etched away from the surface 34 in the trenches area (FIG. 16).

The trenches 132 are then etched (FIG. 17) into the silicon substrate 30 as described above, followed by the slot-cutting in the back side of the substrate as explained above in connection with FIG. 8.

FIGS. 18-23 illustrate the process steps undertaken in providing a hard mask in accordance with yet another aspect of this invention. Only a single trench 232 is shown, for simplicity.

Figure 18:
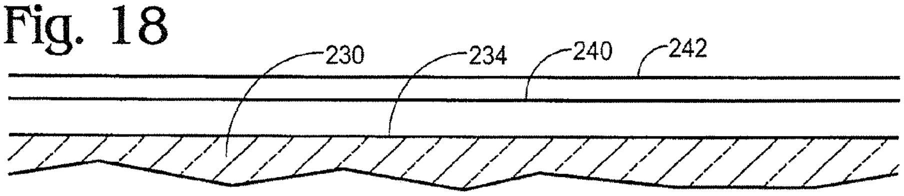
FIGS. 18-23 illustrate the process steps undertaken in accordance with yet another aspect of this invention.

FIG. 18 illustrates the front surface 234 of the silicon substrate 230, having a GOX layer 240 grown thereon. Atop the GOX layer 240 there is deposited a 1000 Å layer of polysilicon 242. Apart for an area preserved for the transistor gate function as mentioned above, the polysilicon layer 242 is then completely etched from the trench area.

Figure 19:
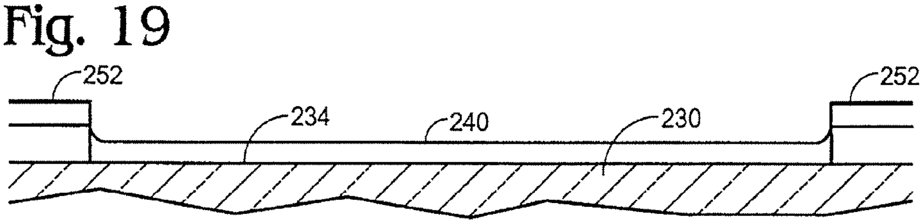

A metals layer 252, corresponding the conductor layer 52 of the first-described embodiment, is deposited over the GOX layer 240. During the dry etching process associated with this metals layer 252, the GOX layer that remains between the edges of layer 252 is over-etched with that etchant, thereby reducing the thickness of the exposed GOX layer 240, as depicted in FIG. 19.

Figure 20:
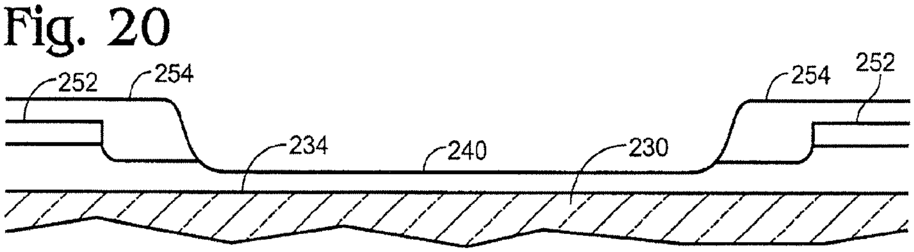

Next, FIG. 20, a passivation layer 254 corresponding to the passivation layer 54 described above is deposited and etched to cover the GOX layer 240 up to the edges of the GOX layer that will define the boundaries 250 of the trench 232. The etchant applied to the passivation layer 254 (used to define the openings or "vias" mentioned above) is also used to over-etch the GOX layer 240 to reduce further the thickness of that layer over the trench, as shown in FIG. 20.

Figure 21:
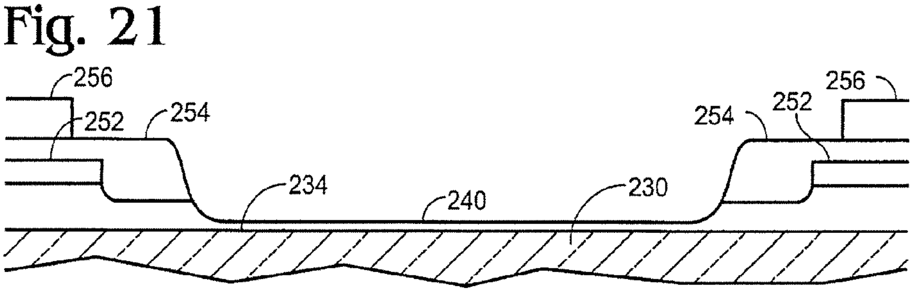
Figure 22:
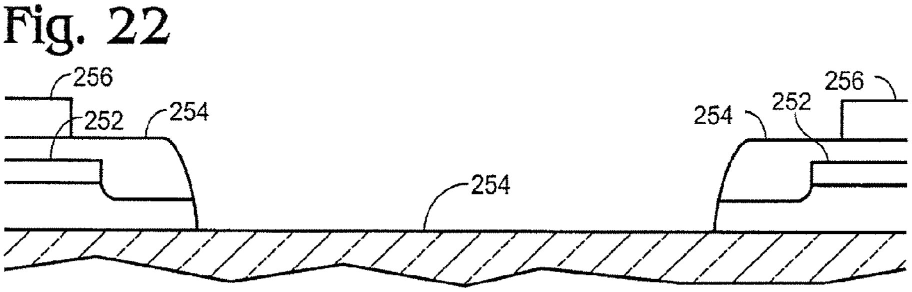
Figure 23:
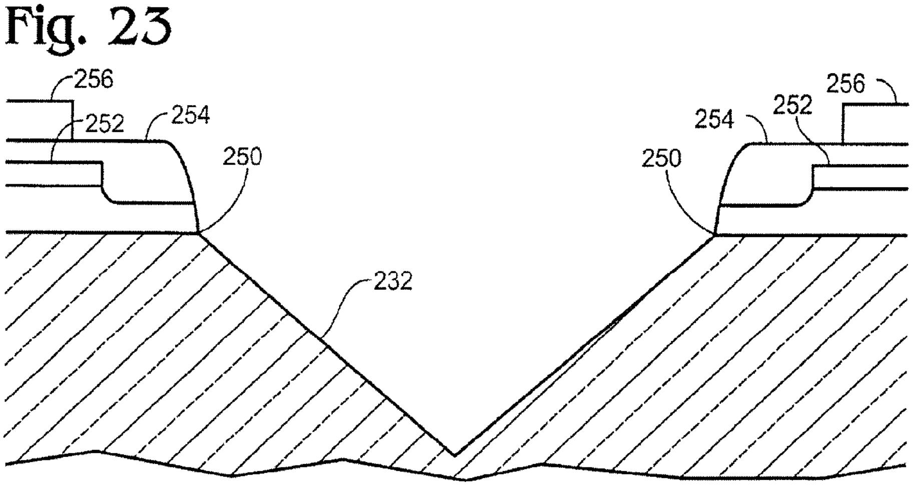

FIG. 21 illustrates the results of a deposition and etching of a metal layer 256 that corresponds to the metal layer 56 described above. The metal dry etch that applied to this layer is used to over-etch the exposed GOX layer 240 thereby further thinning that layer. This is followed by a metals wet-etching step (FIG. 22) that completely removes the remaining GOX layer 240 so that the trench 232 can thereafter be formed by the silicon etch described above, with the passivation-capped GOX material serving as a hard mask as shown in FIG. 23.

It is contemplated that there are many possible variations available for fabricating drop generator components along the lines described above. One of ordinary skill, however, will be able to readily adapt the processes of the present invention in response to such variation to arrive at the hard mask assemblies illustrated in FIGS. 8, 17, and 23, and there equivalents.

Moreover, although the foregoing description has focused on the production of mechanisms suitable for inkjet printing, it will be appreciated that the present invention may also be applied to the production of drop generators for any of a variety of applications, such as aerosols that are suitable for pulmonary delivery of medicine, scent delivery, dispensing precisely controlled amounts of pesticides, paints, fuels, etc.

Thus, having here described preferred embodiments of the present invention, the spirit and scope of the invention is not limited to those embodiments, but extend to the various modifications and equivalents of the invention defined in the appended claims.

The invention claimed is:

1. An assembly for conducting liquid across a portion of a substrate, comprising:

a transistor and a heat transducer carried on the substrate and adapted for instantaneously vaporizing an amount of liquid;

a trench etched into the substrate for conducting the liquid; and a mask layer substantially surrounding the trench and comprising a layer selected from a group of layers that includes an oxide layer that also forms part of the gate of the transistor and a passivation layer that also covers part of the heat transducer.

2. The assembly of claim 1 wherein the mask layer is the oxide layer that is covered with the passivation layer near but spaced slightly from the trench.

3. The assembly of claim 1 wherein the mask layer is the passivation layer and wherein the passivation layer is covered with a metal layer.

4. The assembly of claim 3 wherein a layer of phosphosilicate glass underlies the passivation layer at locations near but spaced slightly from the trench.

5. The assembly of claim 4 wherein the passivation layer includes silicon nitride and silicon carbide.

6. The assembly of claim 1 including a cartridge to which the assembly is connected, the cartridge supplying liquid to the assembly.

7. An assembly, comprising:

a substrate;

at least one drop generator for ejecting drops of ink from the substrate;

a layer configured to serve as a component of drop generator and as a mask to define the boundaries of at least one trench; and at least one trench etched within the boundaries, the at least one trench configured for moving ink across the substrate.

* * * * *